United States Patent [19]
Kubota

[11] Patent Number: 4,841,168
[45] Date of Patent: Jun. 20, 1989

[54] MASTER SLAVE LATCH CIRCUIT WITH RACE PREVENTION

[75] Inventor: Katuhisa Kubota, Kawasaki, Japan

[73] Assignee: Fujitsu Limited, Kawasaki, Japan

[21] Appl. No.: 929,795

[22] Filed: Nov. 13, 1986

[30] Foreign Application Priority Data

Nov. 26, 1985 [JP] Japan .................................. 60-266462
Mar. 20, 1986 [JP] Japan .................................. 61-062914

[51] Int. Cl.⁴ .................... H03K 3/284; H03K 17/16; H03K 19/02
[52] U.S. Cl. ................................ 307/272.2; 307/443; 307/445; 307/480
[58] Field of Search ............... 307/443, 445, 480, 269, 307/272 A, 272 R

[56] References Cited

U.S. PATENT DOCUMENTS 3,588,545  5/1971  Wright ................... 307/445
4,554,465  11/1985  Koike .................... 307/480
4,675,553  5/1987  Price et al. .............. 307/272.2

OTHER PUBLICATIONS

Patent Abstracts of Japan, vol. 6, No. 28 (E-95), [906], Feb. 19, 1982; & JP-A-56 149 114 (Nippon Denki K.K.), 11-18-81.
IBM Technical Disclosure Bulletin, vol. 26, No. 12, May 1984, pp. 6692, 6693; J. C. St. Clair, "Scannable Flip-Flops for CMOS LSI".

*Primary Examiner*—Stanley D. Miller
*Assistant Examiner*—Margaret Rose Wambach
*Attorney, Agent, or Firm*—Staas & Halsey

[57] ABSTRACT

A master slave latch circuit is formed by a master latch circuit for outputting a master output signal and a slave latch circuit for outputting a slave output signal. A latch gate of the master latch circuit is formed so that it uses a data gate in common with the slave latch circuit. Accordingly, racing can be avoided and the number of gates can be reduced, and thus the advantage of an increase in the density of the circuit can be obtained.

3 Claims, 12 Drawing Sheets

MASTER SLAVE LATCH CIRCUIT WITH RACE PREVENTION

BACKGROUND OF THE INVENTION

1. Field of the Invention

The present invention relates to a master slave latch circuit, more particularly, it relates to an improvement of a circuit construction thereof.

2. Description of the Related Art

Conventionally, a latch circuit is formed by a clock driver gate which outputs a positive clock pulse and a negative clock pulse, a data gate which inputs one of the output clock pulses of the clock driver gate and a data signal, a latch gate which inputs the other output clock signal of the clock driver gate and an output of the latch circuit, and an output gate which inputs the output of the data gate and the output of the latch gate, and then outputs an output signal.

A conventional master slave latch circuit is formed by combining two latch circuits above. However, the clock driver cannot be commonly used to obtain a skew required for the circuit operation, as explained below. Further, as explained below, in the master slave latch circuit mentioned above, a racing phenomenon may occur because each gate in the master slave latch circuit has a different operation characteristic.

SUMMARY OF THE INVENTION

An object of the present invention is to provide a master slave latch circuit having a circuit construction by which the possibility of such racing is removed.

Another object of the present invention is to provide a master slave latch in which the number of gates is decreased so that a high density circuit can be obtained.

The above-mentioned objects can be achieved by providing a master slave latch circuit formed by a master latch circuit for outputting a master output signal and a slave latch circuit for outputting a slave output signal, wherein a latch gate of the master latch circuit is formed so that it uses a data gate in common with the slave latch circuit.

The above mentioned object can be achieved by a master slave latch circuit formed by a clock driver gate for outputting a positive phase clock pulse and an inverted phase clock pulse, a data gate for inputting one of the output clock pulses of the clock driver gate and a data signal; a first latch gate for inputting the other of the output clock pulses of the clock driver gate and a master output signal; a master output gate for inputting the output of the data gate and the output of the first latch gate and for outputting a master output signal; a second latch gate for inputting an input clock pulse for the clock driver gate or one of the output clock pulses of the clock drive gate as one input and for inputting the slave output signal as another input; and a slave output gate for inputting the output of the first latch gate as one input, for inputting the output of the second latch gate as another input, and for outputting a slave output signal.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1A:
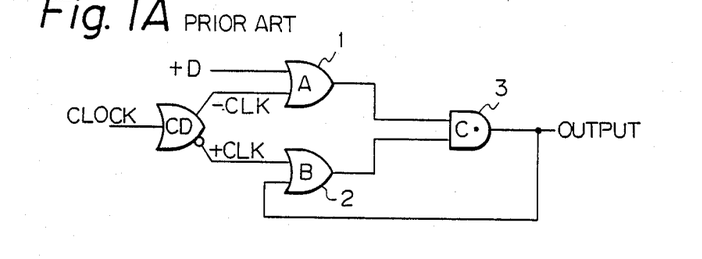
FIGS. 1A and 1B are block diagrams of an example of two kinds of conventional latch circuits.
Figure 1B:
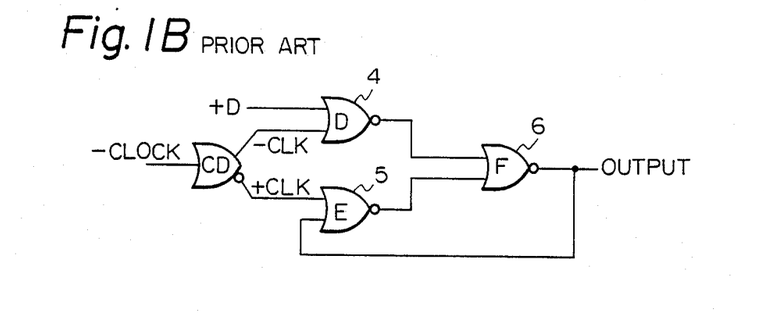

FIG. 1A and FIG. 1B show two examples of a conventional latch circuit. In FIG. 1A a latch circuit is formed by OR gates. A data signal (+D) is input to an OR gate 1(A) (an input gate), a negative clock (−CLK) is input from a clock driver CD to the OR gate 1(A), a positive clock (+clock) is input from the clock driver CD to the OR gate 2(B), and the OR gate 2(B) and a dot gate 3(C) (a collector dot AND gate) are cross-connected as a flip-flop.

FIG. 1B shows a latch circuit formed by NOR gates. A data signal (+D) is input to a NOR gate 4(D) (an input gate) wherein the data signal is inverted, and NOR gates 5(E) and 6(F) are formed as a flip-flop.

Figure 2:
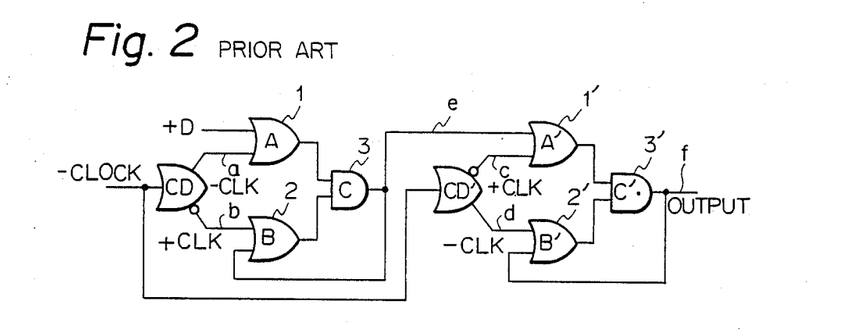
FIG. 2 is a block diagram of one example of a conventional master slave latch circuit.

When two of these latch circuits are suitably combined, a master slave latch circuit can be formed. FIG. 2 shows a master slave latch circuit formed by two of the latch circuits shown in FIG. 1A. In FIG. 2, 1', 2', 3', DC' denote gate circuits the same as 1, 2, 3, DC of FIG. 1A. The clock drivers CD an CD' can not be commonly used because they have opposite phases, and if they were commonly used, the necessary skew could not be obtained.

Figure 3:
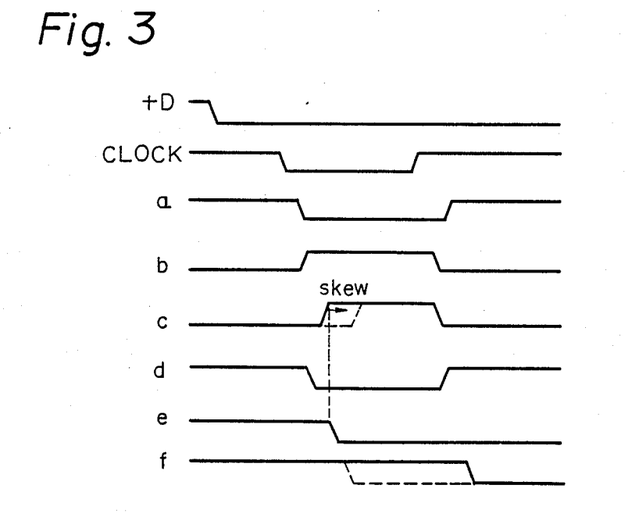
FIG. 3 shows a time chart of signals in the master slave latch circuit shown in FIG. 2.

FIG. 3 shows a time chart of a signal in the master slave circuit shown in FIG. 2. In FIG. 3, "+D" is a data signal, CLOCK is an input clock signal, a is an output line a signal (−CLK) from a clock driver CD, b is an output line b signal (+CLK) from the clock driver CD, c is an output line c signal (+CLK) from the clock driver CD', d is an output line d signal (−CLK) from the clock driver CD', e is an e line signal from a flip-flop gate of a master portion, and f is an output line signal f from a slave portion.

If such a circuit construction is formed, the operation characteristic of each gate becomes different, and accordingly, a negative (−) signal from the e line arrives prior to a positive (+) signal from the c line which is skewed, and thus racing (malfunction) occurs.

In FIG. 3, the solid lines for c and f are waveforms in a normal operation, and the broken lines are waveforms during a malfunction.

In a normal operation, when a signal falls, the data signal "+D" appears as the output signal e of the gate 3. When the output signal e appears, the signal c rises, and thus the OR gate 1' does not transmit the signal e to the output side that is, the OR gate 1' is ion a so called closed state. Thereafter, when the signal c falls, the OR gate 1' transmits the signal e to the output side. That is, the OR gate 1' is opened, and the signal e is output from a gate 3' as the signal f.

Namely, in a normal operation, the master slave latch outputs the output when a front edge of the clock signal reaches the master side latch. During this clock signal period, the slave side latch is closed, and the output appears when a falling edge of the clock signal reaches the slave side latch. Here, as shown by the broken line in FIG. 3, when the signal c arrives later than the signal e, the OR gate 1' is open at the time the signal e appears, and the OR gate 1' then transmits the signal e to the output side. As a result, the gate 3' outputs the signal e as the signal f. In other words, the racing operation, in which the output appears at the slave side at a front edge of the clock signal, occurs. This phenomenon is not limited to the master slave circuit shown in FIG. 2, but occurs also when other kinds of latch circuits are combined.

The present invention provides a master slave circuit having a circuit construction by which the possibility of racing is avoided.

The above problems can be solved, according to the present invention, by a master slave latch circuit wherein a latch gate of a master latch circuit is commonly used as a data gate by a slave latch circuit.

That is, the present invention, the master slave latch circuit is formed so that one specified gate is commonly used by the master latch circuit and the slave latch circuit.

Accordingly, racing can be avoided and the number of gates can be decreased.

Hereinafter, the embodiments will be detailedly explained by referring drawings.

Figure 4:
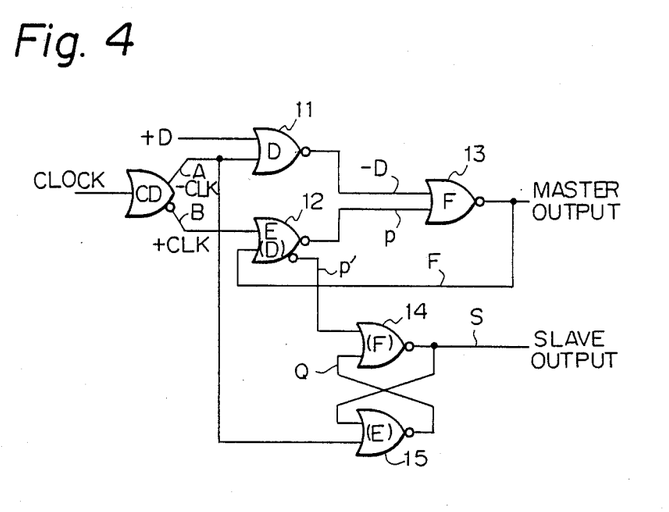
FIG. 4 is a circuit block diagram of a first embodiment of a master slave latch circuit according to the present invention.

FIG. 4 is a block diagram of one embodiment of a master slave latch circuit according to the present invention. In this embodiment, two of the conventional latch circuit formed by the NOR gates shown in FIG. 1B are combined, and one gate thereof is commonly used. In FIG. 4, 11, 12, and 13 form a gate of the master latch circuit (wherein 12 and 13 are formed as a flip-flop), and 12, 14, and 15 form a gate of the slave latch circuit (wherein 14 and 15 are formed as a flip-flop). As shown in FIG. 4, the gate 12 is formed as a dual NOR output circuit and is commonly used by the master latch circuit and the slave latch circuit. The gate 12 operates as a flip-flop gate for the master latch circuit, and as a data gate for the slave latch circuit.

Figure 5:
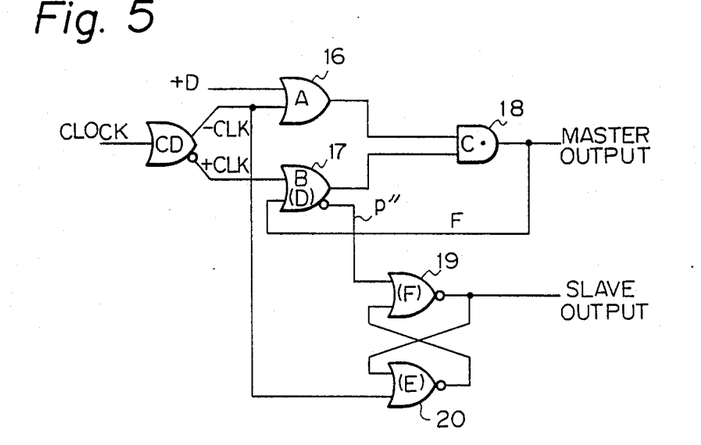
FIG. 5 is a circuit block diagram of a second embodiment of a master slave latch circuit according to the present invention.

FIG. 5 is a block diagram of a second embodiment of the master slave latch circuit according to the present invention. In this embodiment, the latch circuits shown in FIG. 1A and FIG. 1B are combined and one gate is used in common. In FIG. 5, 16, 17, and 18 form a gate of the master latch circuit (wherein 17 and 18 are formed as a flip-flop), and 17, 19 and 20 form a gate of the slave latch circuit (wherein 19, 20 are formed as a flip-flop). As shown in FIG. 5, the gate 17 is commonly used by the master latch circuit and the slave latch circuit.

In the above circuits, when the signal is applied via the gate 12 of the master latch circuit to the gate 14 of the slave latch circuit (see FIG. 4), and similarly, via the gate 17 to the gate 19 of the slave latch circuit (see FIG. 5), racing cannot occur. Further, as one gate (12 or 17) is commonly used, only one clock driver is used, and thus the data gate exclusively used for the slave latch circuit can be omitted, which considerably reduces the number of gates.

Figure 6:
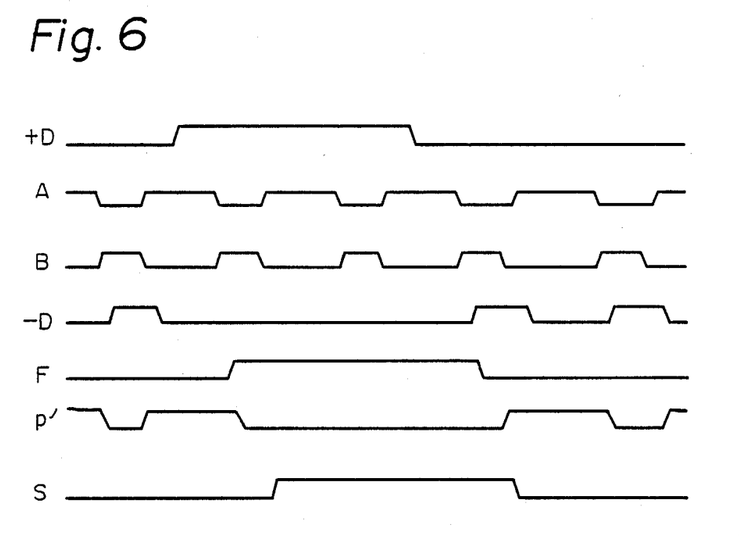
FIG. 6 shows a time chart of signals in the master slave latch circuit shown in FIG. 4.

FIG. 6 shows a time chart of the master slave circuit shown in FIG. 4. In FIG. 6, "+D" is a data signal, A is an output line A signal (−CLK) from a clock driver CD, B is an output line B signal (+CLK) from the clock driver CD, −D is a signal from the output line −D, F is an output (master) signal from the gate 13, P' is an output of the gate 12 and an input signal of the gate 14, and S is a slave output signal.

Figure 7:
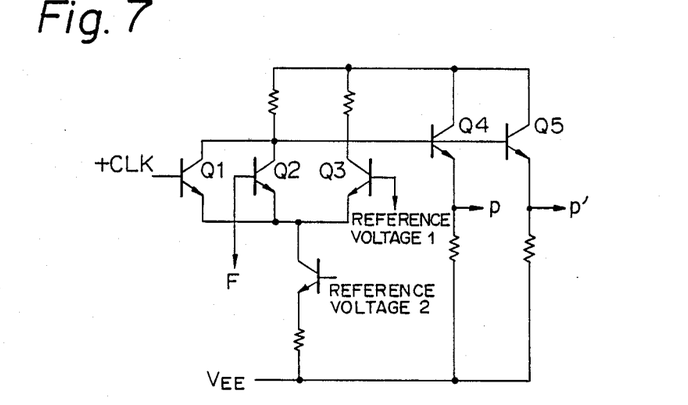
FIG. 7 is a circuit diagram of one example of the gate 12 shown in FIG. 4.

FIG. 7 is a drawing of the circuit of the gate 12 commonly used by the master and slave latch circuits. The symbols in FIG. 7 correspond to those used in FIG. 4. In FIG. 7, $Q_1$ is a transistor for inputting the clock signal (+CLK), $Q_2$ is a transistor for inputting the master output signal F, $Q_3$ is a transistor for inputting a reference voltage, and $Q_4$ and $Q_5$ are emitter follower transistors for taking out the output.

In this circuit, to avoid mulfunction of the slave latch circuit, the signal transmission speed of the clock→+CLK→P' must be slower than the signal transmission speed of the clock→−CLK→P. This can be achieved by providing a skew in the +CLK signal or slowing the fall of P'. To delay the fall of P', it is necessary to make the emitter follower resistance of the transistor $Q_5$ larger than the emitter follower resistance of the transistor $Q_4$ or to add a capacitor to the output of the transistor $Q_5$. Alternatively, a delay gate may be inserted at P'.

Figure 8:
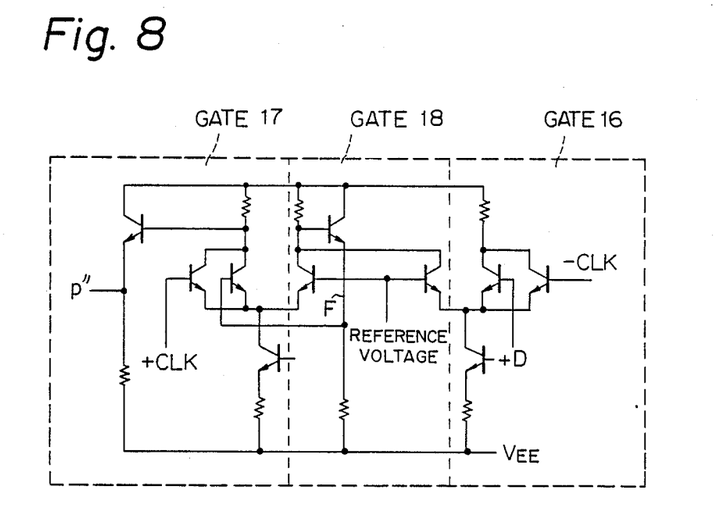
FIG. 8 is a circuit diagram of one example of the gates 16, 17, and 18 shown in FIG. 5.

FIG. 8 is a drawing of the circuit of the commonly used gate 17 in the master slave latch circuit shown in FIG. 5 and gates 16 and 18 adjacent to the gate 17. The circuit of the gate 17 is on the left in the figure and the circuit of the gate 16 is on the right. The connecting portion between the gates 16 and 17 is the circuit of the gate 18.

Figure 9:
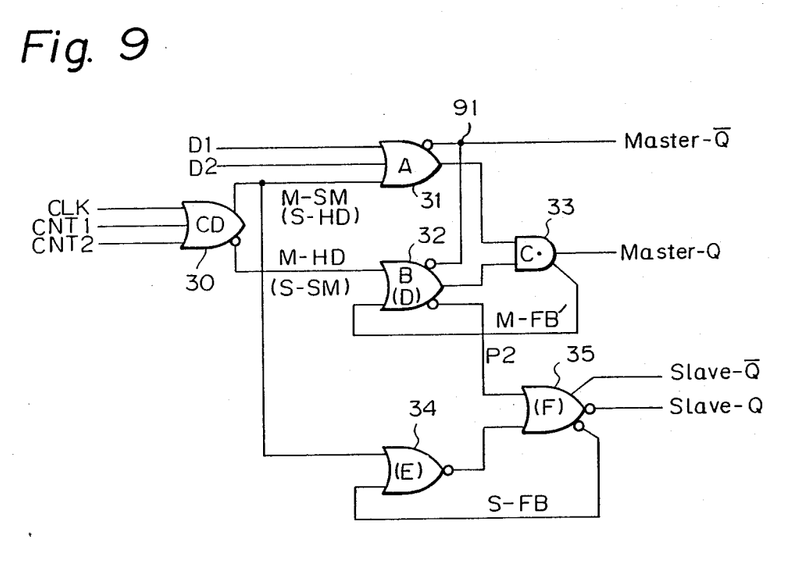
FIG. 9 is a circuit block diagram of a third embodiment of the present invention.

FIG. 9 is a block circuit diagram of a third embodiment of the present invention. In FIG. 9, 30 is a clock driver, 31, 32, and 33 are gates forming a master latch circuit, and 32, 34 and 35 are gates forming a slave latch circuit. In this embodiment, 32 is the gate used in common.

The embodiment shown in FIG. 9 is a modification of the embodiment shown in FIG. 5. In this embodiment as in the embodiment of FIGS. 10–14), control signals CNT1 and CNT2 are added to the clock driver, and two wires D1 and D2 of the input data line are connected to the data gate of the master latch circuit. (The CNT1 and CNT2 inputs are conventional "select" inputs, the signals on which control the operation of the clock driver. For example, in FIG. 9, the clock driver will only output a −CLK signal, thereby enabling data latch 31 to output a data signal D1 or D2 applied to its input, when both CNT1 and CNT2 are low (0). This operation is a conventional operation for latch circuits.) In this circuit, the inverted output signal Q of the master and slave is also output. In FIG. 9, reference numeral 91 designates a wired OR (emitter OR) circuit.

Figure 10:
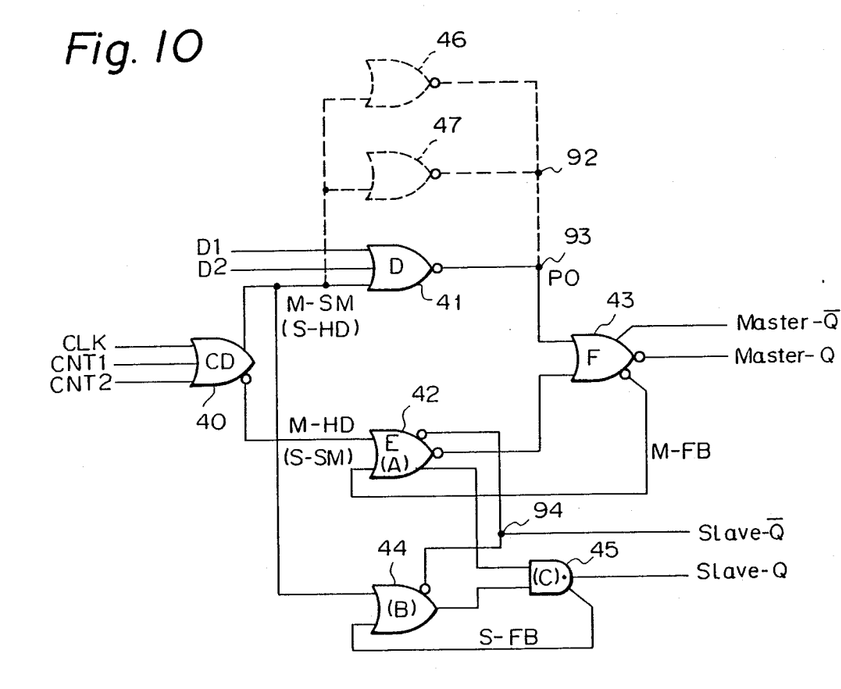
FIG. 10 is a circuit block diagram of a fourth embodiment of the present invention.

FIG. 10 is a block circuit diagram of a fourth embodiment of the present invention. In FIG. 10, 40 is a clock driver, 41, 42, and 43 are gates forming a master latch circuit, 42, 44, and 45 are gates forming a slave latch circuit, and 46 and 47 are gates which are added when necessary, i.e., if the input data is increased. In this embodiment, 42 is the gate used in common, and 92, 93, and 94 are wired OR circuits.

Figure 11:
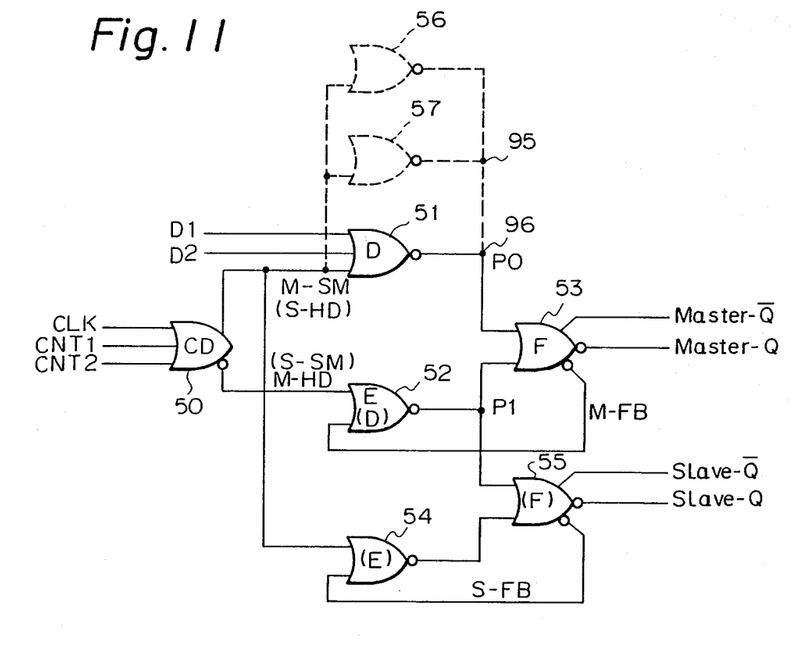
FIG. 11 is a circuit block diagram of a fifth embodiment of the present invention.

FIG. 11 is a block circuit diagram of a fifth embodiment of the present invention. In FIG. 11, 50 is a clock driver, 51, 52, and 53 are gates forming a master latch circuit, 52, 54, and 55 are gates forming a slave latch circuit, and 56 and 57 are gates which are added when necessary, i.e., if the input data is increased. In this embodiment, 52 is the gate used in common, and 95 and 96 are wired OR circuits.

The embodiment shown in FIG. 11 is a slight modification of the embodiment shown in FIG. 4.

Figure 12:
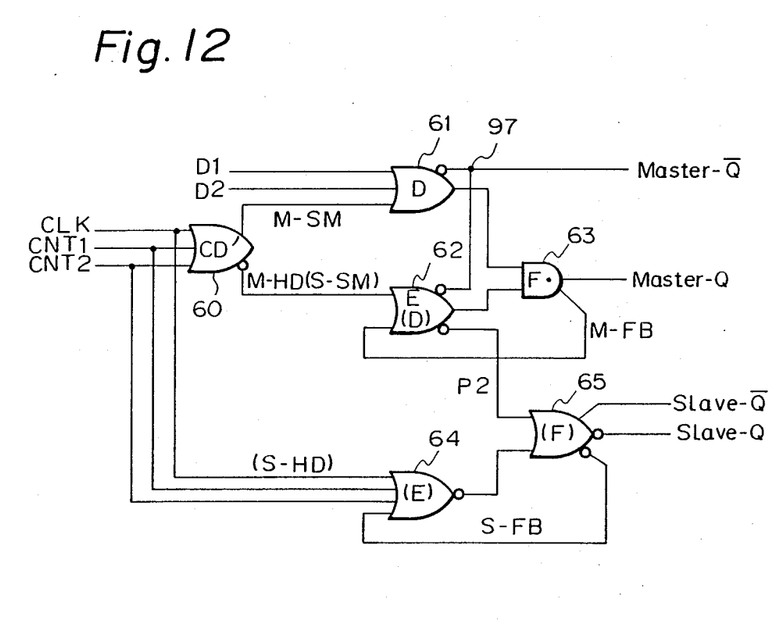
FIG. 12 is a circuit block diagram of a sixth embodiment of the present invention.

FIG. 12 is a block circuit diagram of a sixth embodiment of the present invention. In FIG. 12, 60 is a clock driver, 61, 62, and 63 are gates forming a master latch circuit, and 62, 64, and 65 are gates forming a slave latch circuit. In this embodiment, 62 is the gate used in common, and 97 is a wired OR circuit.

The embodiment shown in FIG. 12 is similar to the embodiments shown in FIG. 5 and FIG. 9, but differs therefrom in that the clock input of the latch gate 64 of the slave latch circuit is introduced from an input side of the clock driver 60.

Figure 13:
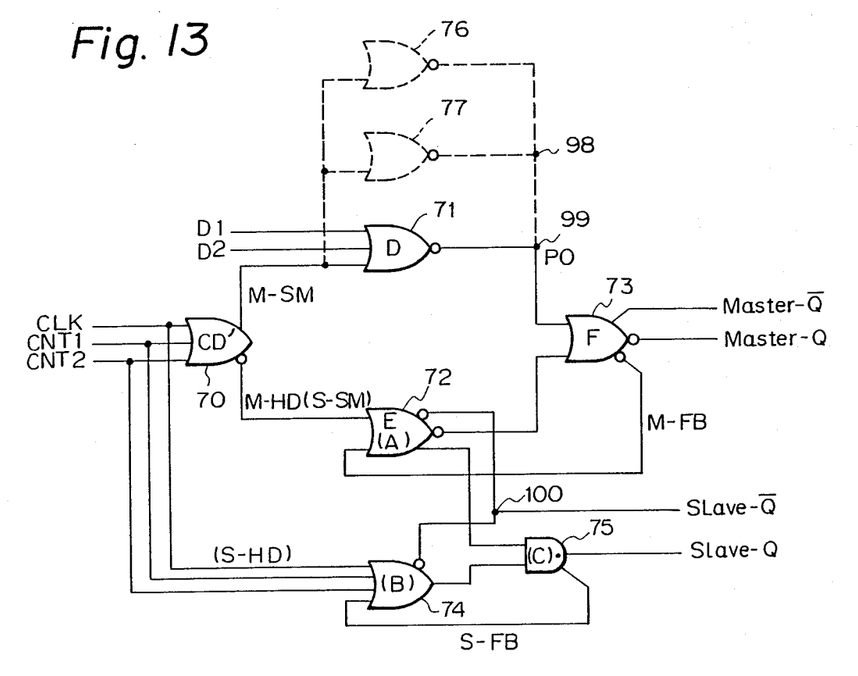
FIG. 13 is a circuit block diagram of a seventh embodiment of the present invention.

FIG. 13 is a block circuit diagram of a seventh embodiment of the present invention. In FIG. 13, 70 is a clock driver, 71, 72, and 73 are gates forming a master latch circuit, 72, 74 and 75 are gates forming a slave latch circuit, and 76 and 77 are gates which are added when necessary, i.e., if the input data is increased. In this embodiment, 72 is the gate used in common, and 98, 99, 100 are wired OR circuits.

The embodiment shown in FIG. 13 is similar to the embodiment shown in FIG. 10, but differs therefrom in that the clock input of the latch gate 74 of the slave latch is introduced from an input side of the clock driver 70.

Figure 14:
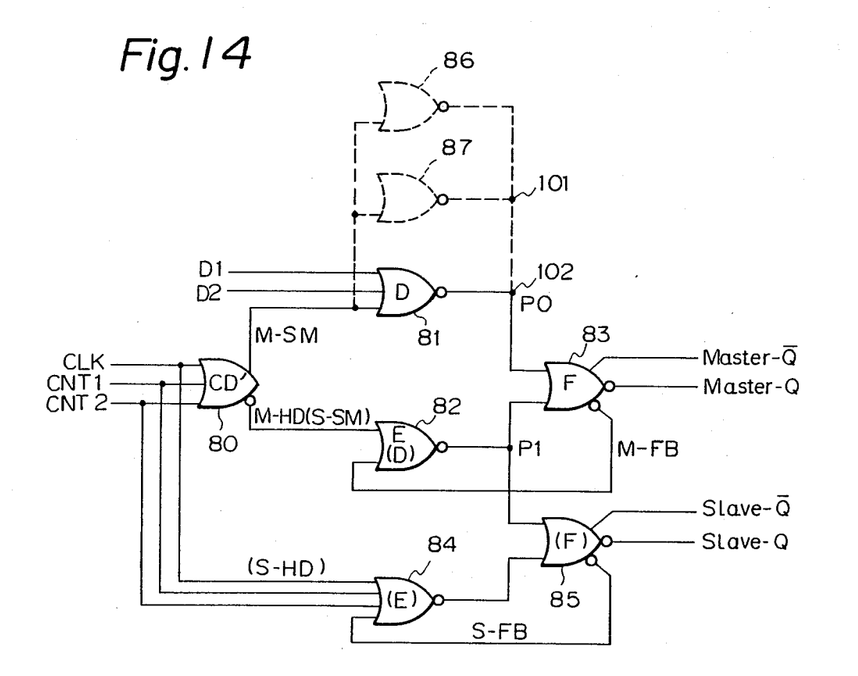
FIG. 14 is a circuit block diagram of an eighth embodiment of the present invention.

FIG. 14 is a circuit block diagram of an eighth embodiment of the present invention. In FIG. 14, 80 is a clock driver, 81, 82, and 83 are gates forming a master latch circuit, 82, 84, and 85 are gates forming a slave latch circuit, and 86 and 87 are gates which are added when necessary, i.e., if the input data is increased. In this embodiment, 82 is the gate used in common, and 101, 102 are wired OR circuits.

The embodiment shown in FIG. 14 is similar to the embodiment shown in FIG. 4 and FIG. 11, but differs therefrom in that the clock input of the latch gate 84 of the slave latch is introduced from an input side of the clock driver 80.

Figure 15:
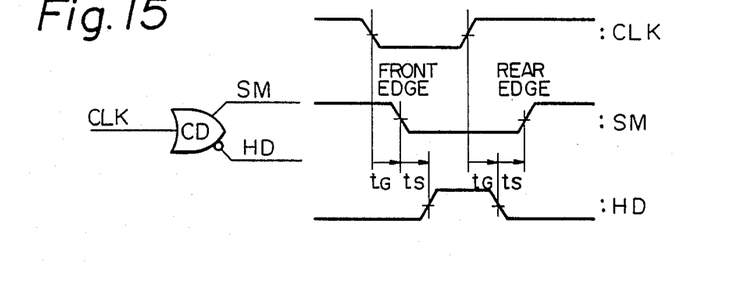
FIG. 15 is a diagram for explaining an example of the operation of the clock driver CD.

FIG. 15 is a diagram for explaining an example of the operation of the clock driver CD shown in FIG. 4, 5, 9, 10, and 11. In FIG. 15, CLK is an input clock signal, SM is a sample, HD is a hold signal, $t_G$ is a delay per one gate stage, and $t_S$ is a skew value. In this example, the values of $t_G$, $t_S$ for each rise and fall may be different.

Figure 16:
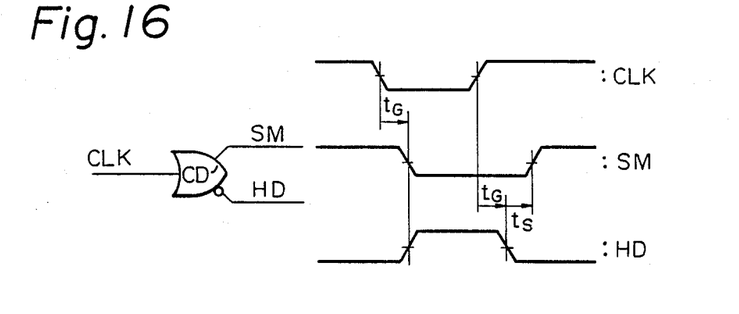
FIG. 16 is a diagram for explaining an example of the operation of the clock driver CD'.

FIG. 16 is a diagram for explaining an example of the operation of the clock driver CD′ shown in FIGS. 12, 13, and 14. The same elements as shown in FIG. 15 are given the same symbols. In the construction shown in FIGS. 12 and 13, and 14, the clock driver CD may be used instead of the clock driver CD′ shown in FIG. 16. Further, when the clock driver shown in FIG. 16 is used in the construction shown in FIGS. 12, 13 and 14, a time required for one stage of the clock driver can be used instead of the skew value at the front edge of the clock driver, and the speed of the master latch is improved by the skew time of at the front edge of the signal.

Figure 17:
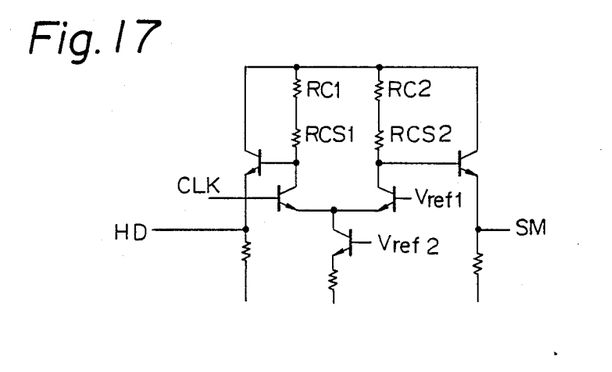
FIG. 17 is a diagram showing an example of the circuit of the clock driver CD.
Figure 18:
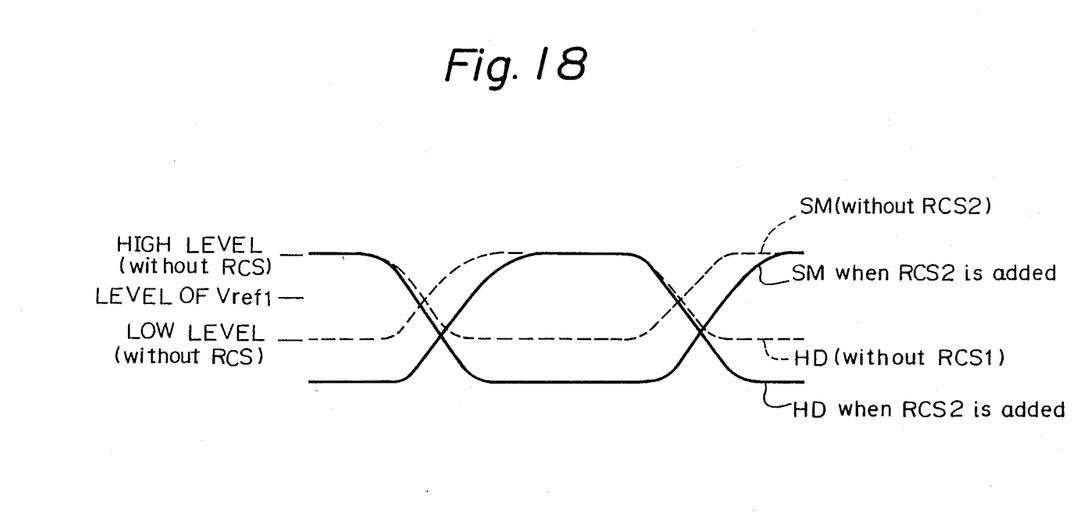
FIG. 18 is a diagram showing an example of the waveform in the clock driver CD.

FIG. 17 is a diagram showing an example of the clock driver CD, and FIG. 18 is a diagram showing an example of the waveforms in the clock driver CD. In FIG. 17, when the resistors RCS1, RCS2 are not added, the sample siganl SM and the hold signal HD are varied as shown by broken lines in FIG. 18. When the resistors RCS1, SCS2 are added, the sample signal SM and the hold signal HD are varied as shown by the solid line in FIG. 18, in such a manner that the low level side has a deep fall. This is because the current from the differential transistor is a constant current, and thus a superfluous voltage drop is generated by an amount due to adding the resistors, and this result appears in the sample signal SM and the hold signal HD. Accordingly, the rise of the waveform of both the SM and the HD signal is delayed, and thus the skew time $t_S$ is obtained.

When the rise of the SM signal along is delayed, as shown in FIG. 16, the resistor RCS1 in the circuit shown in FIG. 17 may be omitted.

As understood from the above description and accompanying drawings of the embodiment, according to the present invention, racing can be avoided and the number of gates can be reduced, and therefore the advantage of an increase in the density of the circuit can be obtaianed.

I claim:

1. A master slave latch circuit, comprising:
   clock means for outputting clock pulses each having first and second edges;
   a master latch circuit, having a latch gate, outputting a master output signal in synchronization with the first edge of each clock pulse; and
   a slave latch circuit outputting a slave output signal in synchronization with the second edge of each clock pulse, said latch gate of said master latch circuit operating as a data gate for said slave latch circuit.

2. A master slave latch circuit according to claim 1, wherein said clock means comprises a clock driver gate outputting a first clock pulse of a first phase and a second clock pulse of second phase opposite ot said first phase and wherein said master slave latch circuit further comprises:
   a data gate having an output and receiving said first clock pulse and a data signal;
   a first latch gate having an output and receiving said second clock pulse and said master output signal;
   a master output gate receiving the output of said data gate and the output of said first latch gate and outputting said master output signal;
   a second latch gate receiving said first clock pulse and said slave output signal; and a slave output gate receiving the output of said first latch gate and an output of said second latch gate and outputting said slave output signal.

3. A master slave latch circuit, comprising:

clock means for outputting clock pulses, each having first and second edges;

master latch circuit means for outputting a master output signal synchronously with the first edges of each clock pulse; and slave latch circuit means for outputting a slave output signal synchronously with the second edge of each clock pulse.

* * * * *

UNITED STATES PATENT AND TRADEMARK OFFICE
CERTIFICATE OF CORRECTION

PATENT NO. : 4,841,168
DATED : JUNE 20, 1989
INVENTOR(S) : KATUHISA KUBOTA

It is certified that error appears in the above-identified patent and that said Letters Patent is hereby corrected as shown below:

Col. 1, line 22, delete "above".

Col. 2, line 61, "DC'" (both occurrences) should be --CD'--.

Col. 3, line 3, "cis" should be --c is--;
line 11, "fromthe" should be --from the--;
line 20, "ion" should be --in--.

Col. 6, line 1, "sample " should be --sample signal--;
line 15, delete "of";
line 23, "SCS2" should be --RCS2--;
line 33, "along" should be --alone--;
line 41, "obtaianed" should be --obtained--.

Col. 8, line 1, "edges" should be --edge--.

Signed and Sealed this

Sixth Day of March, 1990

Attest:

JEFFREY M. SAMUELS

*Attesting Officer*  *Acting Commissioner of Patents and Trademarks*